(12) United States Patent
Keppler et al.

(10) Patent No.: US 7,663,523 B1
(45) Date of Patent: Feb. 16, 2010

(54) SYSTEM UNIT ELEMENT SELECTION

(75) Inventors: Marc L. Keppler, Bozeman, MT (US); Donald C. Thelen, Jr., Bozeman, MT (US)

(73) Assignee: ON Semiconductor, Phoenix, AZ (US)

( * ) Notice: Subject to any disclaimer, the term of this patent is extended or adjusted under 35 U.S.C. 154(b) by 0 days.

(21) Appl. No.: 12/098,357

(22) Filed: Apr. 4, 2008

(51) Int. Cl.
  *H03M 1/66* (2006.01)
(52) U.S. Cl. ................ 341/144; 341/138; 341/139
(58) Field of Classification Search ............ 341/138, 341/139, 144
  See application file for complete search history.

(56) References Cited

U.S. PATENT DOCUMENTS

| | | | |
|---|---|---|---|
| 5,404,142 A | | 4/1995 | Adams et al. |
| 5,841,384 A | * | 11/1998 | Herman et al. ............ 341/138 |
| 6,348,884 B1 | | 2/2002 | Steensgaard-Madsen |
| 6,522,277 B2 | * | 2/2003 | Fujimori et al. ............ 341/144 |
| 6,535,155 B2 | | 3/2003 | Ruha et al. |
| 6,686,860 B2 | * | 2/2004 | Gulati et al. ............... 341/155 |
| 6,894,632 B1 | * | 5/2005 | Robinson .................. 341/143 |
| 7,239,258 B2 | * | 7/2007 | Grosso et al. ............. 341/139 |
| 2003/0085827 A1 | | 5/2003 | Koifman et al. |

OTHER PUBLICATIONS

Vadipour, Morteza. Techniques for Preventing Tonal Behavior of Data Weighted Averaging Algorithm in Σ-Δ Modulators. TCASII, Nov. 2000.

Radke, Russ et al. A 14-bit Current-Mode ΣΔ DAC Based Upon Rotated Data Weighted Averaging. JSSC, Aug. 2000.
Miller, Matthew et al. A Multibit Sigma-Delta ADC for Multimode Receivers. JSSC, Mar. 2003.
Chen, Kuan-Dar et al. An Improved Technique for Reducing Baseband Tones in Sigma-Delta Modulators Employing Data Weighted Averaging Algorithm Without Adding Dither. TCASII, Jan. 1999.
Galton, Ian. Spectral Shaping of Circuit Errors in Digital-to-Analog Converters. TCASII, Oct. 1997.
Keady, A. et al. Comparison of Mismatch Error Shaping in Multibit Oversampled Converters. Electronics Letters, Mar. 1998.
Schreier, R. et al. Noise-shaped Multibit D/A Converter Employing Unit Elements. Electronics Letters, Sep. 1995.
Geerts, Y. el al. A High-Performance Multibit ΔΣ CMOS ADC. Journal of Solid State Circuits, Dec. 2000.
Vleugels, K. et al. A 2.5V Sigma-Delta Modulator for Broadband Communications Applications. Journal of Solid State Circuits, Dec. 2001.
Carly, Richard. A Noise-Shaping Coder Topology for 15+ Bit Converters. Journal of Solid State Circuits, Apr. 1989.

* cited by examiner

*Primary Examiner*—Jean B Jeanglaude
(74) *Attorney, Agent, or Firm*—Workman Nydegger

(57) ABSTRACT

The management of unit element selections in a system that includes multiple unit elements. The system includes an element selection component that is configured so that each of the multiple elements is used the same number of times over a certain number of selection cycles. This preserves the first order noise shaping of the mismatch noise thereby keeping a high signal to noise ratio. In addition, the selection of the unit elements is not done in a periodic fashion. This allows the system to avoid tones within the signal band.

21 Claims, 9 Drawing Sheets

700A

| Flash | 0 0 0 0 1 1 1 | — 701A |
| Nshuffle | 0 1 0 1 0 0 1 | — 702A |
| Nmem | 0 0 0 0 0 0 0 | — 703A |
| FillEmpty | 0 1 0 0 1 0 1 | — 704A |
| Cnflcts | 0 0 0 0 0 0 0 | — 705A |

Count = 0  — 706A

| IndVec | 1 0 1 1 0 1 0 | — 707A |

Sel = 0  — 708A

| NewFill | 0 0 0 0 0 0 0 | — 709A |
| NewMem | 0 1 0 0 1 0 1 | — 710A |
| Nsel | 0 1 0 0 1 0 1 | — 711A |
| Nmem | 0 1 0 0 1 0 1 | — 712A |

| Flash | 0 0 0 1 1 1 1 | — 701B |
| Nshuffle | 1 0 1 1 0 1 0 | — 702B |
| Nmem | 0 1 0 0 1 0 1 | — 703B |
| FillEmpty | 1 1 1 1 1 1 1 | — 704B |
| Cnflcts | 0 0 0 0 0 0 0 | — 705B |

Count = 0  — 706B

| IndVec | 0 0 0 0 0 0 0 | — 707B |

Sel = 1  — 708B

| NewFill | 0 0 0 0 0 0 0 | — 709B |
| NewMem | 1 1 1 1 1 1 1 | — 710B |
| Nsel | 1 0 1 1 0 1 0 | — 711B |
| Nmem | 0 0 0 0 0 0 0 | — 712B |

| Flash | 0 0 0 0 0 1 1 | — 701E |
| Nshuffle | 0 1 0 0 1 0 0 | — 702E |
| Nmem | 0 0 0 0 0 0 0 | — 703E |
| FillEmpty | 0 1 0 0 1 0 0 | — 704E |
| Cnflcts | 0 0 0 0 0 0 0 | — 705E |

Count = 0 — 706E

| IndVec | 1 0 1 1 0 1 1 | — 707E |

Sel = 1 — 708E

| NewFill | 0 0 0 0 0 0 0 | — 709E |
| NewMem | 0 1 0 0 1 0 0 | — 710E |
| Nsel | 0 1 0 0 1 0 0 | — 711E |
| Nmem | 0 1 0 0 1 0 0 | — 712E |

| Flash | 0 0 0 0 1 1 1 | — 701F |
| Nshuffle | 1 1 0 0 0 1 0 | — 702F |
| Nmem | 0 1 0 0 1 0 0 | — 703F |
| FillEmpty | 1 1 0 0 1 1 0 | — 704F |
| Cnflcts | 0 1 0 0 0 0 0 | — 705F |

Count = 1 — 706F

| IndVec | 0 0 1 1 0 0 1 | — 707F |

Sel = 0 — 708F

| NewFill | 0 0 0 0 0 0 1 | — 709F |
| NewMem | 1 1 0 0 1 1 1 | — 710F |
| Nsel | 1 0 0 0 0 1 1 | — 711F |
| Nmem | 1 1 0 0 1 1 1 | — 712F |

*FIG. 7F*

SYSTEM UNIT ELEMENT SELECTION

BACKGROUND OF THE INVENTION

Many systems (such as circuits) have an array of similar components (often referred to as "unit elements") that are ideally identical. The type of unit element will depend typically on the nature of the system itself. Such elements might be, for example, a capacitor, a resistor, an inductor, a transistor, or any other dynamic component, or any combination of such components. Although designed to have ideally identical performance and dimensions, imperfect fabrication processes result in some component mismatch between unit elements.

Some systems are sensitive to such mismatch. For instance, some systems repeatedly use a subset of the total number of unit elements for multiple iterations, where the number of unit elements used may differ from one iteration to the next. In such systems, the effects of component mismatch may be reduced by, for example, using the same unit element approximately the same number of times as time moves forward from iteration to iteration.

An example of such a system is a feedback Digital-to-Analog Converter (DAC) of high resolution sigma-delta Analog-to-Digital Converters (ADCs). In multi-bit DACs, component mismatches leads to differences in the step size between successive DAC output levels. Any non-linearity in the feedback DAC of a sigma-delta modulator adds directly to the modulator input. Accordingly, the matching precision of the DAC unit elements should be on the same order as the overall precision of the sigma-delta ADC.

Non-linearity in multi-bit feedback DACs is a well-known phenomenon. Many techniques to reduce this non-linearity exist. The most basic solution is to use a 1-bit DAC. Since a 1-bit DAC has only two output levels, its linearity is guaranteed. However, 1-bit DACs are susceptible to overload and for a given over-sampling ratio, they reduce the Signal-to-Noise Ratio (SNR) below what would be possible with a multi-bit DAC.

Because multi-bit DACs provide many advantages over their 1-bit counterparts, many dynamic element matching algorithms have been invented that shape the spectrum of DAC mismatch noise and move a large part of that noise outside of the signal band. While such techniques reduce the DAC mismatch noise that is contained in the signal band, they often either raise the thermal noise floor or are susceptible to inducing idle tones inside the signal band. Idle tones are noise spikes that are visible in the system's output frequency spectrum. These noise spikes, which reduce the system SNR if they are within the signal band of interest, are generated when the unit components are used in a periodic fashion.

One method to eliminate the idle tones is to randomly select the unit components. Since the unit components are not used in a periodic fashion, idle tones are eliminated. Unfortunately, pure randomization converts the DAC mismatch noise into white noise which raises the noise floor and reduces the system SNR.

BRIEF SUMMARY

Some embodiments described herein relate to the management of unit element selection in a system that includes multiple unit elements. The system includes an element selection component that is configured so that each of the multiple elements is used the same number of times over a certain number of selection cycles. This preserves the first order noise shaping of the mismatch noise thereby keeping a high Signal-to-Noise Ratio (SNR). In addition, the selection of the unit elements is not done in a periodic fashion thereby attenuating idle tones within the signal band.

In one embodiment, the selection component keeps track of which unit elements have been used more, and which unit elements have been used less since a particular time. At each of some or all of the selection cycles, the selection component identifies how many unit elements are to be used in that selection cycle. In one embodiment, a selection cycle may be a single clock cycle although this is not required. If the number of unit elements to be selected is less than the number of less-used unit elements, the unit elements are selected in a non-periodic and non-predetermined fashion from the less-used elements. If the number of unit elements to be selected is equal to the number of less-used unit elements, the less-used unit elements are selected for use in that selection cycle. If the number of unit elements to be selected is greater than the number of less-used unit elements, the less-used unit elements are selected for use, and the excess number is selected from the other unit elements. The excess number may be selected in a non-periodic and non-predetermined manner. In one embodiment, the set of less-used and more-used unit elements are updated for each selection cycle in which a unit element is selected for use.

The number of usages for each of the unit elements tends towards the same value. In one embodiment, to prevent the noise floor from increasing, the unit elements are used the same number of times after m*N unit elements have been used, where N is the number of unit elements used in the system, and m is a positive integer. This allows the mismatch noise to be first order noise shaped, instead of white noise, thereby keeping the noise floor in the signal band low, and keeping the SNR high. In addition, by performing the selection in a non-periodic manner, unwanted idle tones in the signal band may be avoided, thereby preserving signal integrity and reliability. The unit element selection management may be incorporated into any system that includes multiple unit elements, especially where that system is sensitive to component mismatch in the unit element.

Additional embodiments will be set forth in the description that follows, and in part will be obvious from the description, or may be learned by the practice of the invention. The embodiments of the invention may be realized and obtained by means of the instruments and combinations particularly pointed out in the appended claims. These and other embodiments of the present invention will become more fully apparent from the following description and appended claims, or may be learned by the practice of the invention as set forth hereinafter.

BRIEF DESCRIPTION OF THE SEVERAL VIEWS OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 7A through 7G illustrate the state of various data structures that may be used to select unit elements in accordance with a second aspect that uses look-ahead to select unit elements, the state being shown for seven consecutive selection cycles, respectively.

DETAILED DESCRIPTION OF THE PREFERRED EMBODIMENTS

Some embodiments described herein relate to the management of unit element selections in a system that includes multiple unit elements. The system includes an element selection component that is configured so that each of the multiple elements is used the same number of times over a certain number of selection cycles. This preserves the first order noise shaping of the mismatch noise thereby keeping a high signal to noise ratio. In addition, the selection of the unit elements is not done in a periodic fashion thereby avoiding tones within the signal band. In one embodiment, the system may be a circuit, although not required.

Figure 1:
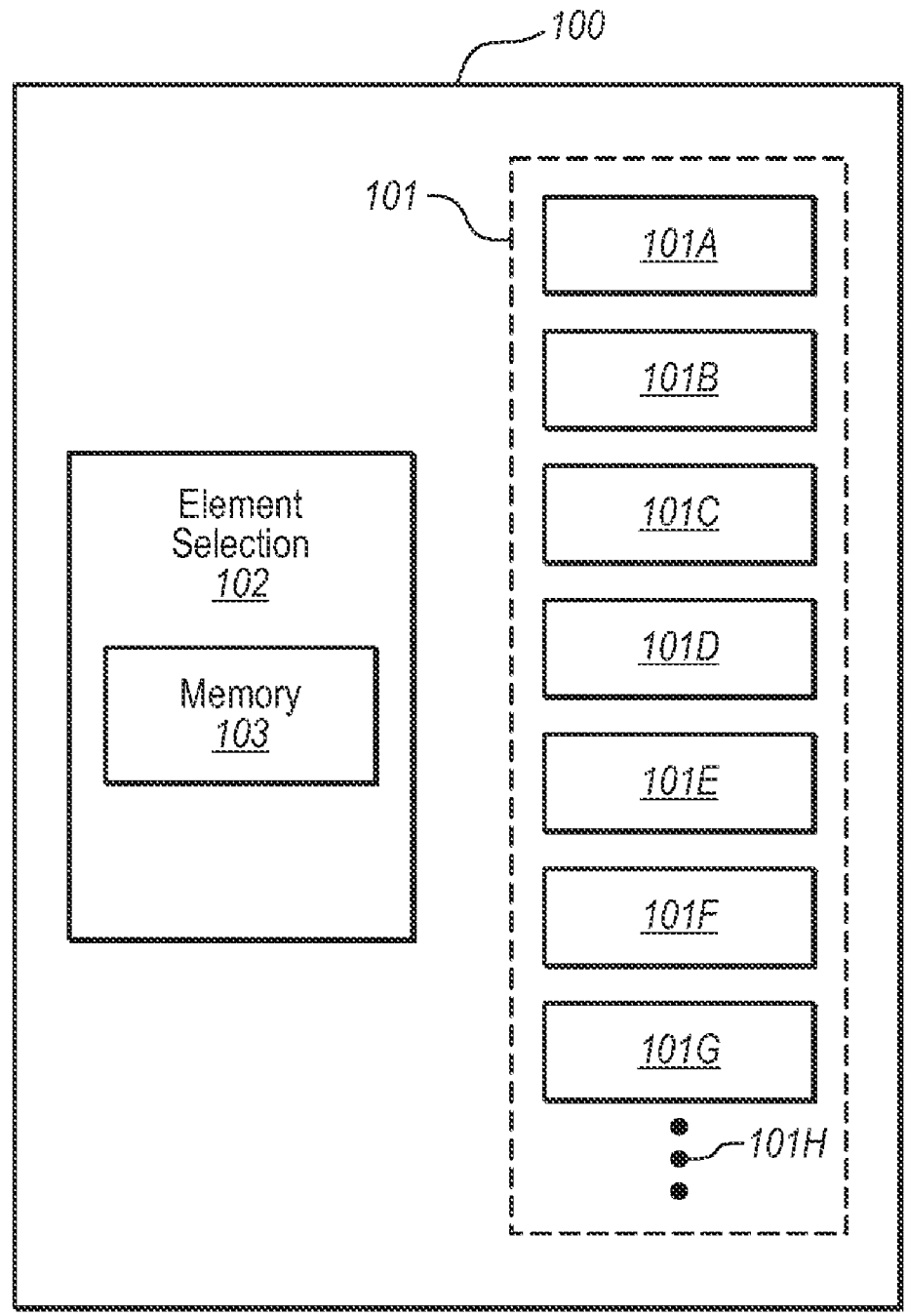
FIG. 1 illustrates a system that includes multiple unit elements, and a selection mechanism that selects a subset of the elements for use each selection cycle.

FIG. 1 illustrates a system 100 that includes a number of unit elements. In this example, the system 100 is illustrated as including 7 unit elements 101A, 101B, 101C, 101D, 101E, 101F and 101G. However, the ellipses 101H represents that the principles described herein may be used with systems having any number of unit elements. For instance, the principles described herein may operate with any system having two or more unit elements. The unit elements will be also collectively be referred to as "unit elements 101" hereinafter. The nature of the unit elements 101 will depend on the nature of the system 100 itself. The unit elements may be, for example, a resistor, a capacitor, an inductor, a transistor, another dynamic element, or any combination of the above. The system 100 is subjected to a sequence of selection cycles. For each selection cycle, a subset (i.e., zero or more, but less than or equal to all) of the unit elements may be used. In the case where a subset of unit elements is selected each clock cycle, a clock cycle may be synonymous with a selection cycle. However, a clock cycle might be equal to or greater than the frequency of the selection cycle.

To average out and smooth the effects of component mismatch, the system 100 includes an element selection mechanism 102, which is configured to select the elements 101 for each selection cycle in a manner that preserves some or all of the first order noise shaping of the mismatch noise thereby keeping the noise floor of the system 100 lower at least for lower frequencies. In addition, the selection mechanism 102 performs the selection in a manner that any idle tones in the signal band are significantly attenuated or even eliminated, thereby improving signal quality. When a system attenuates noise within a given frequency range of interest, it is commonly referred to as "noise shaping". A system is said to exhibit "first order noise shaping" if it has a high-pass filter function with a slope of approximately 20 dB per decade. In the frequency domain, this implies the system has a zero at or near Direct Current (DC). However, there may still be advantages in using the principles described herein to perform high pass noise shaping of other types other than first order noise shaping.

In one embodiment that will be described more fully with respect to FIG. 5, the system 100 may be used as a feedback Digital-to-Analog Converter (DAC) in a sigma-delta Analog-to-Digital Converter (ADC) modulator. Doing so may allow the accuracy of the feedback DAC to be improved, thereby supporting a higher resolution ADC. This may facilitate 12-bit, 14-bit or even higher resolution ADCs using a manageable amount of chip space. However, the principles described herein are not limited by any means to this particular implementation. The principles may be used advantageously for any system that uses unit elements for which minimizing component mismatch is important. There are an enormous number of such systems. Examples include 1) any over-sampled system, 2) Nyquist rate data converters, 3) any integrator, or 4) any pre-amplifier stage.

The system 100 operates to manage the usage of the unit elements 101 such that after a certain number of selection cycles, each of the unit elements have been used the same number of times, where that certain number may be permitted to vary over time. This allows the noise of the system 100 to be first order noise shaped, which has a lower noise floor in the lower frequencies. By having an appropriate clock speed, therefore, the noise floor in the signal band of interest may likewise be kept low. This contrasts with a method for randomly choosing the unit elements without regard for the historical selection of the unit elements. Such a purely random selection process would result in white noise, which would represent a significant increase in the noise floor in the signal band of interest, thereby reducing the Signal-to-Noise Ratio (SNR).

That said, the principles of the present invention do not disregard the benefits of random selection altogether. Rather, the selection mechanism 102 chooses the unit elements to use in a current selection cycle in consideration of the history of the prior unit element selections. That history may be maintained in, for example, memory 103. Given that history, the selection mechanism 102 may choose to randomly or pseudo randomly (or at least not in a pre-deterministic manner) select first those unit elements that have not yet been used the same number of times as the more-used elements. Doing so permits the first order noise shaping, while still attenuating or eliminating idle tones.

A purely random or even a pseudorandom selection of the lesser-used elements is not strictly necessary in order to attenuate idle tones. Rather, embodiments in which there is less than random selection may still attenuate idle tones. For instance, in one embodiment, the selection mechanism 102 first chooses the less-used elements in a manner in which the order to selection of the less-used elements is not predetermined. Alternatively, or in addition, the selection mechanism 102 may select the unit elements such that the probability of selecting any given unit element of the less-used elements is approximately constant given a particular unit selection history. Alternatively or in addition, the unit selection mechanism 102 may select the unit elements such that there is at least a possibility that any permutation of selection orders through the unit elements may be selected. For instance, if there were 4 unit elements labeled A, B, C, and D, the following orders of selection are possible: ABCD, ABDC, ACBD, ACDB, ADBC, ADCB, BACD, BADC, BCAD, BCDA, BDAC, BDCA, CABD, CADB, CBAD, CBDA, CDAB, CDBA, DABC, DACB, DBAC, DBCA, DCAB, DCBA. In general, if there are n possible unit elements, there are n! (read "n factorial") numbers of permutations for the order in which those unit elements may be selected. In addition, from one time to the next, the order selection sequence is free to change. In yet another embodiment, most, or at least ten of the possible permutations of order selection may be used by the selection mechanism 102.

Figure 2:
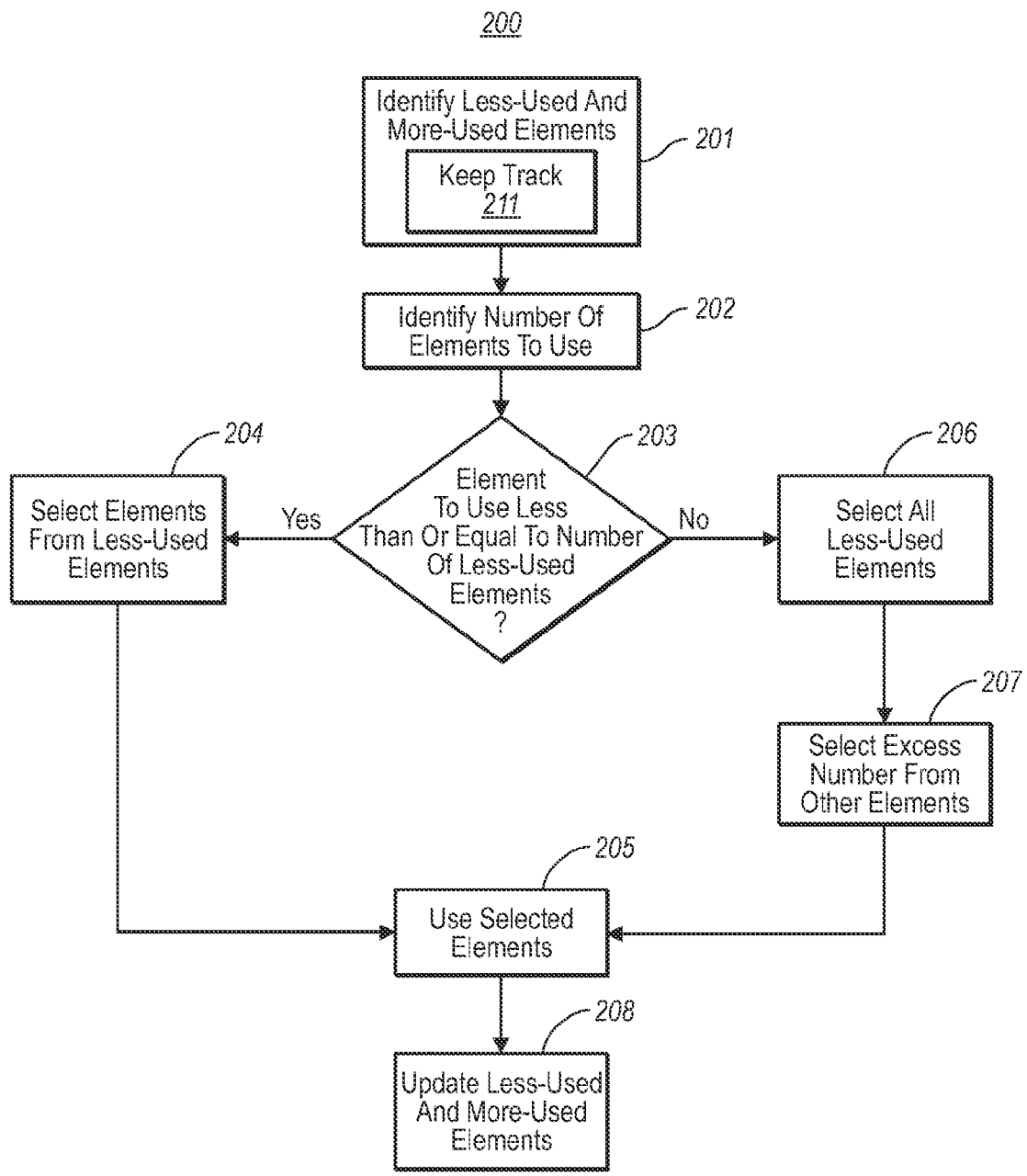
FIG. 2 illustrates a flowchart of a method for selecting a subset of unit elements for use in a selection cycle.

FIG. 2 illustrates a flowchart of a method 200 for managing unit elements, and represents just one possible method that may be employed by the selection mechanism 102. The method 200 may be performed for at least some, and possibly all of the selection cycles that involve a possible use of the unit elements. The selection mechanism 102 identifies (act 201) a less-used portion and more-used portion of the available unit elements. The more-used portion of the unit elements are those one or more elements that have been used the most number of times. The less-used portion of the unit elements are those one or more elements that have been used fewer times than the more-used elements. In one embodiment, the more-used elements have each been used exactly one more time than each of the less-used elements since a particular reference time in the past.

The identification of the more and less-used unit elements might also involve keeping track in memory of the less-used portion and the more-used portion of the available unit elements (act 211). For instance, in FIG. 1, this may be accomplished using memory 103. The memory 103 might be, for example, a digital state machine, analog switching circuitry, or any other memory capable of retaining information from one selection cycle to the next. In one embodiment, a simple bitmap may be used to keep track where a binary zero represents that the corresponding unit element is less-used, and a binary one represents that the corresponding unit element is more-used. This is the convention used in the example described below with respect to FIGS. 6 and 7A through 7I.

For a given selection cycle, the selection mechanism identifies (act 202) the number of unit elements to be selected. This number might be zero or more, and as many as all of the unit elements. However, the method 200 is most interesting when one or more, but less than all, of the unit elements are selected. The method 200 may also operate for any system in which some subset of the unit elements are to be selected, even if there is some other minimum or maximum number of unit elements imposed for use per selection cycle.

The selection mechanism 102 then determines whether the number of unit elements to use is less than or equal to the number of unit elements in the less-used portion of the unit elements (decision block 203). If the number of unit elements to be selected is less than or equal to the number of less-used unit elements (Yes in decision block 203), then the unit elements are selected from the less-used unit elements (act 204). Here, at least in the case where less than all of the less-used unit elements are selected, the order of selection of the less-used portion may be random, or at least not predetermined prior to the act of selecting. In the case where the number of unit elements to be selected is the same as the number of less-used unit elements, then act 204 will deterministically result in all of the less-used unit elements being selected. The selected elements from the less-used portion are then used (act 205).

If the selection mechanism keeps track of the less-used and more-used unit element portions, the portions might be updated in association with the selected unit elements being used (act 208). For example, suppose there were previously five unit elements less-used, and two elements more-used, and each less-used unit elements were used one less time than each of the more-used unit elements. If two of the less-used unit elements were used in the current selection cycle, those two less-used unit elements would be removed from the set of less-used elements, and added to the set of more-used elements.

In the case where the number of unit elements to be selected was exactly equal to the number of less-used unit elements, all of the less-used elements are then used in the current selection cycle, and the less-used and more-used elements are then updated (act 208). In this case, after usage of the selected unit elements, if the less-used unit elements were previously used exactly one less time than the more-used unit elements, then all elements will have been used exactly the same number of times. Accordingly, when updating the less-used unit elements, all of the unit elements may then be categorized as being less-used.

If the number of unit elements to be selected is greater than the number of less-used elements (No in decision block 203), then all of the less-used elements are selected (act 206), leaving one or more excess unit elements that still should be selected. Those excess elements are also selected (act 207) from the more-used elements. Once again, this selection is performed such that the order of selection from the more-used unit elements is not predetermined prior to the selection. All of the less-used elements and the selected more-used elements are then used (act 205), and the list of less-used elements and more-used elements is then updated (act 208). In this case, the selected more-used elements are included in the updated list of more-used elements, and the remainder of the elements is included in the list of less-used elements.

Figure 3:
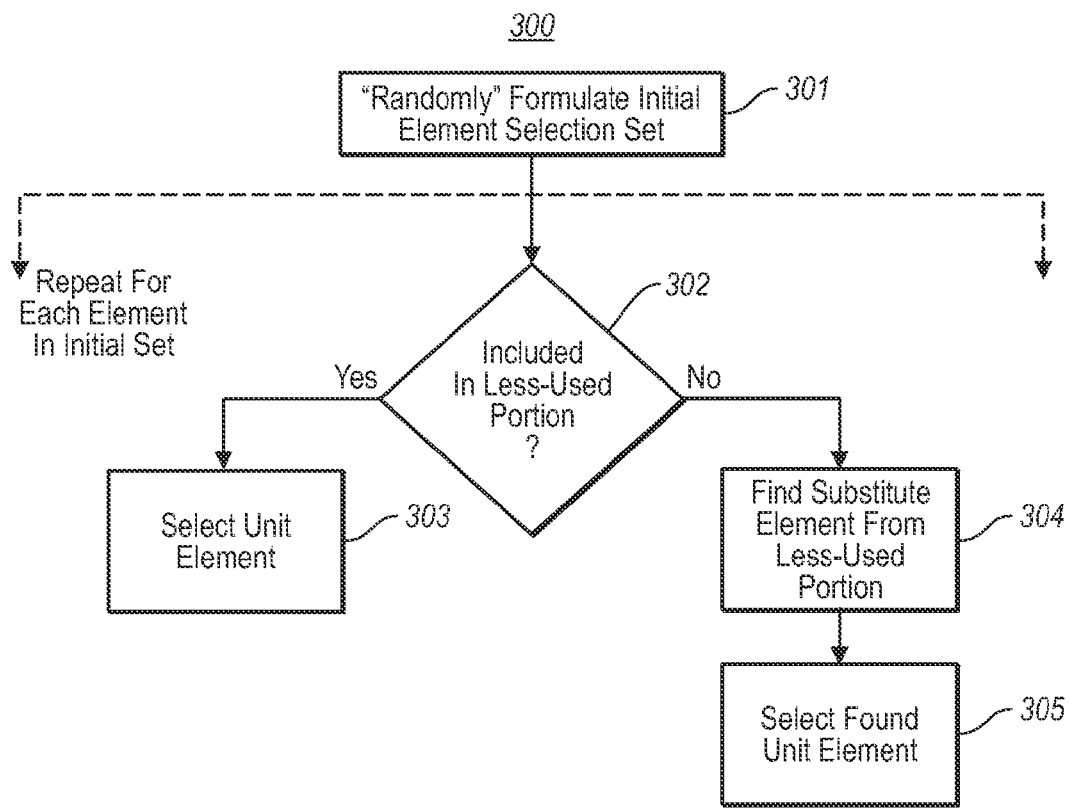
FIG. 3 illustrates a flowchart of a method for non-periodically selecting a portion of the less-used elements in the case where the number of unit elements to be selected is less than the number of less-used elements.

FIG. 3 illustrates a flowchart of a method 300 for selecting less than all of the less-used elements, and may be used in act 204 of FIG. 2 in the case where the number of unit elements to be selected is less than the number of available less-used elements (Yes in decision block 203). The method 300 may also be used in the case where the number of unit elements to be selected is the same as the number of less-used unit elements. In that case, however, despite the randomization act 301, all of the less-used unit elements would end up being chosen deterministically. As an alternative, in this case, the selection mechanism may arrive at the same deterministic result by simply skipping the randomization and just directly selecting all of the less-used elements for use. In FIG. 3, first, an initial set of unit elements is randomly or pseudo randomly selected (act 301). The initial set is made to be the size of the number of unit elements to be selected. In one embodiment, the formulation of this initial set may be made regardless of the identity of the less-used and more-used unit elements. The remainder of the method 300 may be performed for each unit element in the initial set.

If the corresponding unit element is a less-used element (Yes in decision block 302), then that less-used element may simply be selected for use (act 303). If, on the other hand, the corresponding unit element is not a less-used element (No in decision block 302), then a substitute for that unit element is found amongst the less-used elements (act 304). That substitute less-used element may then act as the selected unit element (act 305). In searching for a substitute, the list of unit elements might be navigated in one direction or another until a less-used unit element is found that satisfies the following two criteria: 1) the unit element is a less-used unit element, and 2) the less-used unit element has not already been selected in the current selection cycle. In one embodiment, the direction in which this search is performed may be configurable, and may even change down to the granularity of a selection cycle. The direction may also be randomly chosen from one selection cycle to the next.

Figure 4:
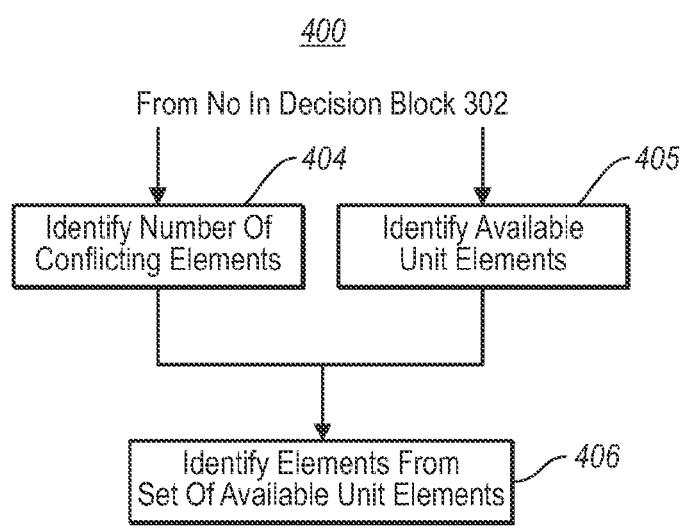
FIG. 4 illustrates an alternative processing flow used when a unit element in an initial element selection set is not a less-used element in the case where the number of unit elements to be selected is less than the number of less-used elements.

FIG. 4 illustrates a flowchart of an alternative flow 400 that may be performed for each unit element in the initial set that is determined to not be one of the less-used elements (No in decision block 302). This alternative flow 400 uses a look-ahead approach to identify the number of unit elements in a set of unit elements (i.e., a conflicting set) in the initial set of elements that are not a less-used unit element (act 404). In addition, the set of available unit elements is identified that may serve as a substitute for the unit elements in the conflicting set (act 405). The set of available unit elements will be any unit element that is both 1) a less-used element, and 2) an element that does not already correspond to a unit element in the initial set. Then, unit elements are selected not from the initial set, but from the set of available unit elements in a predetermined order (act 406). This predetermined order may be configurable, and perhaps changeable down to the granularity of a selection cycle.

Figure 5:
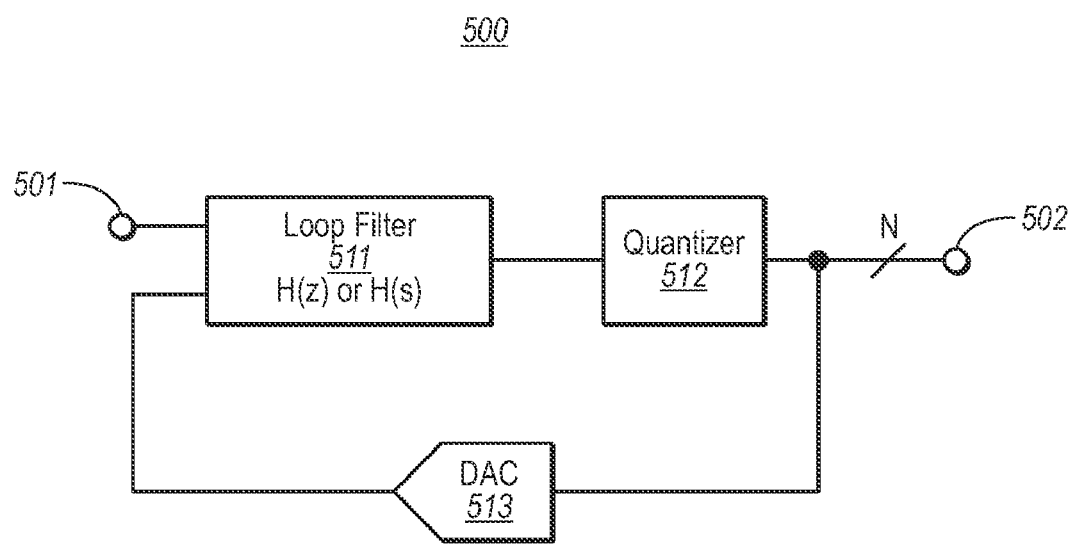
FIG. 5 illustrates a sigma-delta Analog-to-Digital Converter (ADC) modulator that uses a feedback Digital-to-Analog Converter (DAC) that may contain multiple unit elements that are selected in accordance with the principles described herein.

FIG. 5 illustrates an environment 500 in which the system 100 may be used, and represents just one of enumerable environments in which the system 100 might be used. The environment 500 is a sigma-delta Analog-to-Digital Converter (ADC) modulator. The modulator 500 is used as a first stage in a sigma-delta ADC. The modulated signal is then provided to a filter, and most often a decimator.

The sigma-delta ADC modulator 500 includes loop filter 511 that applies a discrete transfer function H(z) or a continuous transfer function H(s) to its differential input. One of the differential inputs is received from the input terminal 501, and the other is a feedback signal received from a feedback Digital-to-Analog Converter (DAC) 513. This feedback DAC 513 represents an example of the system 100 of FIG. 1. Based on the multi-bit digital signal received into the DAC 513 (which is the same as the output signal of the ADC 500 applied to the terminal 502), the DAC 513 will select the appropriate number of unit elements to activate to thereby generate the appropriate analog signal. The transformed signal from the loop filter 511 is then provided to a quantizer 512, which quantizes the input signal into an appropriate multi-bit output signal that is applied to the output terminal 502, and to the input terminal of the feedback DAC 513.

The DAC 513 is very sensitive to component mismatch in its unit elements since mismatch will cause non-linearly in the digital-to-analog conversion, which non-linearly would be fed back into the system to compound the error. By using the principles of the present invention, the average DAC 513 linearity is greatly improved.

Figure 6:
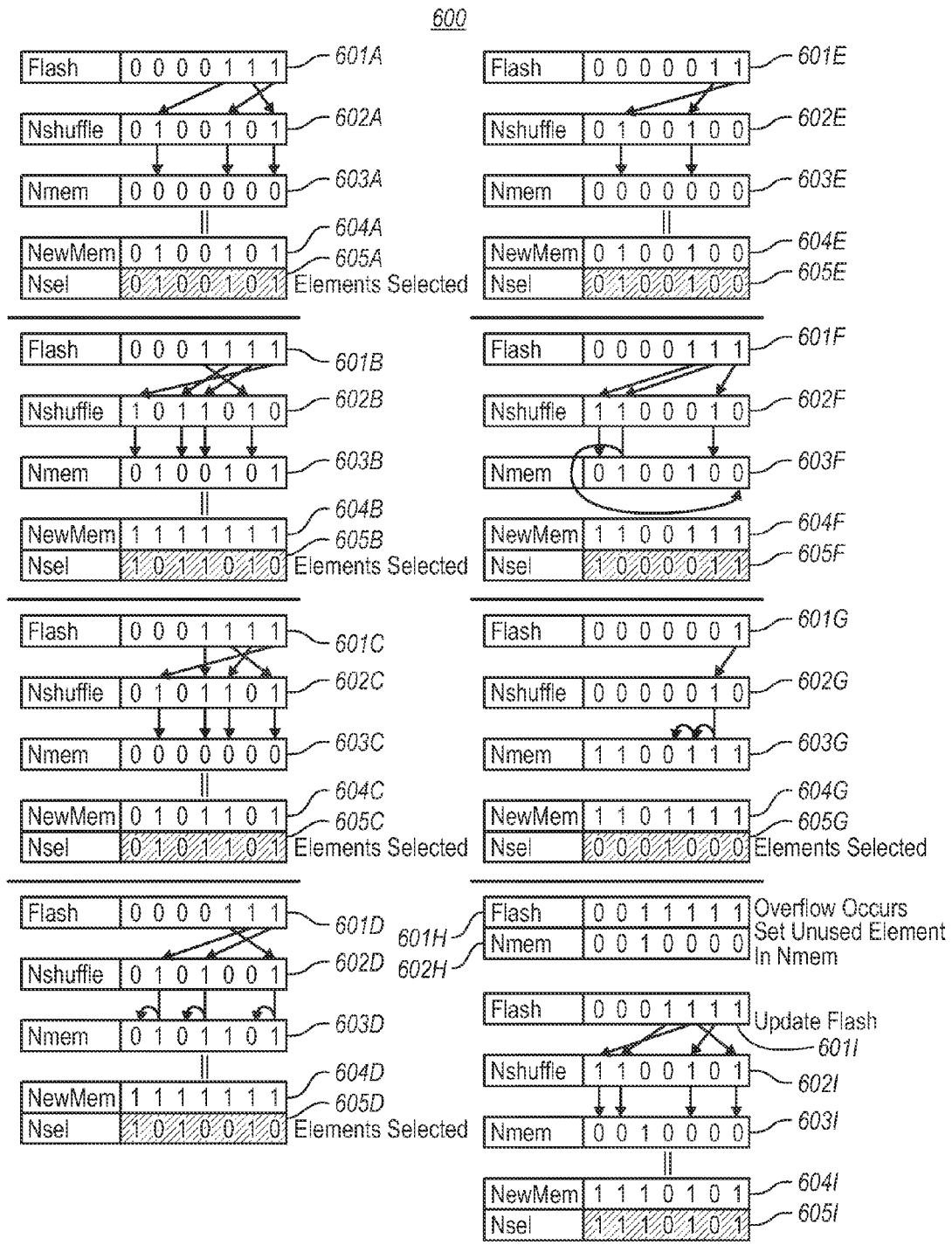
FIG. 6 illustrates the state of various data structures that may be used to select unit elements in accordance with a first aspect that does not use look-ahead to select unit elements, the state being shown for eight consecutive selection cycles.

FIG. 6 illustrates an example processing flow 600 associated with an example system having seven unit elements. The less-used and more-used unit elements are tracked using a binary array called Nmem. The array is represented as a bitmap which each bit corresponding to a particular unit element. Other bitmaps are also used in the example. In the convention used herein, a particular bit in an array may be identified from address 6 in the left bit to address 0 in the right bit. For instance, the left-most bit in array Nmem may be referred to as Nmem[6]. Moving further to the right, the following bits occur in sequence Nmem[5], Nmem[4], Nmem[3], Nmem[2], Nmem[1] and Nmem[0]. The same nomenclature will be applied to the other bitmaps as well. The size of the bitmap would be equal to the number of unit elements used in the system (7 in this example).

In the embodiment of FIG. 6, there are five bitmaps used: Flash, Nshuffle, Nmem, NewMem and Nsel. The states of each of these bitmaps are illustrated in eight successive selection cycles. The first seven selection cycles have the corresponding bitmap states labeled with the suffix A through G, respectively. The eighth selection cycle has the corresponding bitmap state labeled with the suffix H and I.

In this example, the bitmaps Flash and Nmem are used as an input for each selection phase. Flash is a bitmap representing a thermometer-formatted input representing the number of unit elements to be used in the current selection cycle. In other words, the following sequences of bits are used to represented 0 through 6, respectively, 0000000 (for 0), 0000001 (for 1), 0000011 (for 2), 0000111 (for 3), 0001111 (for 4), 0011111 (for 5), 0111111 (for 6) and 1111111 (for 7). Nmem is a bitmap which identifies the less-used unit elements (corresponding to a binary 0) and the more-used unit elements (corresponding to a binary 1). Nshuffle is a bitmap that represents a pseudo-randomization of the unit elements to be used, and represents a shuffling of the Flash bitmap. Nsel is a bitmap that identifies the unit elements selected in the current selection cycle and represents an output from the selection cycle which may be used to directly address the appropriate unit elements. NewMem is a bitmap that represents the memory of all less-used and more-used elements considering all prior selection cycles, and the current selection cycle. Nelem is a scalar that represents the number of unit elements to be selected during the current selection cycle. Nopen is a scalar that represents the number of unit elements in the less-used set of one or more unit elements.

In the first selection phase, three unit elements are to be selected. This is represented in the Flash bitmap using thermometer code. Accordingly, the Flash bitmap has state 601A corresponding to 0000111. The Nmem bitmap begins with state 603A (i.e., 0000000) in which all the unit elements are marked as less-used. The existence of the Nmem bitmap as input to the selection cycle represents an example of act 201 of FIG. 2. The Flash state 601A is pseudo-randomized (i.e., shuffled) into Nshuffle bitmap state 602A. Here, the number of unit elements to be selected is 3 (Nelem=3), whereas the number of less-used unit elements is 7 (Nopen=7). The assignment of the value 3 to parameter Nelem represents an example of the act 202 of FIG. 2. Accordingly, since Nelem is not more than Nopen, overflow has not occurred. Process proceeds differently depending on whether or not overflow has occurred.

If overflow has not occurred as in the case of the first selection cycle, then the Yes condition of decision block 203 of FIG. 2 has occurred, and the elements are selected from the less-used unit elements (act 204). In this example of FIG. 6, this occurs by first shuffling the thermometer coded Flash bitmap state 601A to generate the new vector Nshuffle bitmap state 602A. As previously mentioned, FIG. 3 represents an example of the selection act 204 of FIG. 3. The generation of Nshuffle state represents an example of the random or pseudo random formulation of the initial set of unit elements (act 301).

The selection process then attempts to place the set elements of Nshuffle (where Nshuffle(i)=1, i being any one of the integers 0 through 6) into the corresponding cleared bits of the Nmem state 603A to thereby generate a NewMem state 604A. If the corresponding bit of the Nmem state is clear, then this attempt (corresponding to Yes in decision block 302) will be successful and the corresponding less-used unit element will be selected (act 303) by setting the corresponding bit in NewMem. In the case of this first selection cycle, all of the set bits of Nshuffle 602A including Nshuffle[5], Nshuffle[2] and Nshuffle[0] can be copied into the corresponding bits New-Mem[5], NewMem[2] and NewMem[0], since the bits New-Mem[5,2,0] are all three cleared. While the situation does not apply for the first selection cycle in the example, had a corresponding bit been already set in Nmem, that would mean that the unit element of the initial set is not a less-used unit element (corresponding to No in decision block 302). In that case, the example selection process might find the first non-zero bit of Nshuffle that was not able to be copied into a NewMem because the corresponding bit of Nmem was set, the selection process would then shift that non-zero bit of Nshuffle in a configurable direction (either left or right) until a corresponding zero bit of Nmem is found into which the set bit may be copied. That represents an example of acts 304 and 305 of FIG. 3. This process is repeated for any other non-zero bits found in Nshuffle that were not able to be copied into a corresponding non-zero bit in NewMem.

In the first selection cycle of FIG. 6, however, the resulting NewMem bitmap state 604A is the same as the Nshuffle bitmap state 602A, since all of the bits in NewMem were previously clear. At this point, the NewMem bitmap state 604A identifies all of the elements used on previous iterations as well as the elements to be used on the current iteration. The unit elements to be used on the current iteration as represented by the Nsel bitmap state are then determined by Equation 1 as follows:

$$Nsel = Nmem \oplus NewMem \qquad (1)$$

where ⊕ represents a bitwise exclusive OR operation.

Accordingly, the Nsel bitmap state 605A is 0100101. The new memory Nmem bitmap state is then updated by placing the value of NewMem into Nmem ready to be input into the next selection cycle. Here, Nelem equals Nopen equals 4. Accordingly, the number of unit elements is not less than (No in decision block 203), nor more than (No in decision block 207) the number of less-used elements. In this case, the process may proceed through the pseudo-random creation of Nshuffle bitmap state 602B. In that case, however, the net result will be that all of the less-used elements will be selected. Accordingly, the NewMem bitmap state 604B will be all set, and the Nsel state 605B will be 1011010, where the ones represent the corresponding unit elements to be selected in the second selection cycle. Here, since all of the bits in NewMem are set, the Nmem bitmap is obtained by clearing all of its bits, representing that for the next selection cycle, all unit elements will be considered less-used and thus candidates for selection no matter how many unit elements are to be selected.

In the third selection cycle, four unit elements are to be selected as represented by Flash bitmap state 601C, which is shuffled into Nshuffle state 602C. As previously mentioned, the input Nmem state 603C is all cleared. Accordingly, the set bits of Nshuffle 602C including bits Nshuffle[5,3,2,0] may be copied into the corresponding NewMem 604C bits NewMem [5,3,2,0] to create NewMem state 604C. The corresponding Nsel bitmap state 605C is shown, wherein once again the ones correspond to the unit elements that will be selected this selection cycle.

In the fourth selection cycle, three unit elements are to be selected as represented by Flash bitmap state 601D, which is shuffled into Nshuffle bitmap state 602D. Note that this shuffling process is non-deterministic. The first set bit of Nshuffle 602D is Nshuffle[5]. However, the correspond bit NewMem [5] cannot become set because the corresponding bit Nmem [5] is already set. Accordingly, the set bit Nshuffle[5] is shifted left by configuration to the next cleared bit of Nshuffle, which is in this case Nshuffle[6]. The corresponding bit NewMem[6] can become set because the corresponding bit Nmem[6] is clear. Thus, NewMem[6] becomes set. The same process is performed for set bit Nshuffle[3] to set bit NewMem[4]. The same process is performed for set bit Nshuffle[0] to set bit NewMem[1]. The result is a NewMem bitmap state 604D in which all bits are set. The Nsel bitmap state 605D is 1010010, where the ones identify the unit elements to be selected. Since the NewMem bitmap bits are all set, the Nmem bitmap is cleared.

In the fifth selection cycle, two unit elements are to be selected as represented by Flash bitmap state 601E, which is shuffled into Nshuffle state 602E. As previously mentioned, the input Nmem state 603E is all cleared. Accordingly, the set bits of Nshuffle 602E including bits Nshuffle[5,2] may be copied into the corresponding NewMem 604E bits NewMem [5,2] to create NewMem state 604E. The corresponding Nsel bitmap state 605E is shown, wherein once again the ones correspond to the unit elements that will be selected this selection cycle. The NewMem bitmap is copied into the Nmem bitmap to create an input for the next selection cycle.

In the sixth selection cycle, three unit elements are to be selected as represented by Flash bitmap state 601F, which is shuffled into Nshuffle bitmap state 602F. The Nmem state 603F is shown illustrated two set bits Nmem[5,2]. The first set bit of Nshuffle is Nshuffle[6], which can be copied into New-Mem[6] because the corresponding bit Nmem[6] is clear. The second set bit of Nshuffle is Nshuffle[5]. However, the correspond bit NewMem[5] cannot become set because the corresponding bit Nmem[5] is already set. Accordingly, the set bit Nshuffle[5] is shifted left by configuration to the next cleared bit of Nshuffle, which is in this case Nshuffle[1]. Since Nshuffle[6] was already set, the set bit of Nshuffle[5] was not only shifted left to Nshuffle[6], but was shifted left again to wrap around to Nshuffle[0], which was clear. The corresponding bit NewMem[0] can become set because the corresponding bit Nmem[0] is clear. Thus, NewMem[0] becomes set. The third set bit of Nshuffle is Nshuffle[1], which can be copied into NewMem[1] because the corresponding bit Nmem[1] is clear. Accordingly, the NewMem bitmap state 604F becomes 1100111, which is copied into the Nmem bitmap as input to the next selection cycle. The Nsel bitmap state 605F is 1000011, where the ones identify the unit elements to be selected.

In the seventh selection cycle, only one unit element is to be selected as represented by Flash bitmap state 601G, which is shuffled into Nshuffle bitmap state 602G. The Nmem state 603G is shown illustrating five set bits Nmem[6,5,2,1,0]. The set bit of Nshuffle 602G is Nshuffle[1], which cannot be copied into NewMem[1] because the corresponding bit Nmem[1] is set. Accordingly, the set bit Nshuffle[1] is shifted left by configuration to the next cleared bit of Nshuffle, which is in this case Nshuffle[2]. However, the set bit of Nshuffle[2] also cannot be copied into NewMem[2] because the corresponding bit Nmem[2] is set. Accordingly, the set bit Nshuffle [2] is shifted left by configuration to the next cleared bit of Nshuffle, Nshuffle[3]. Now, since Nmem[3] is clear, the set bit Nshuffle[3] can be copied into NewMem[3]. Accordingly, the NewMem bitmap state 604G becomes 1101111, which is copied into the Nmem bitmap as input to the next selection cycle. The Nsel bitmap state 605G is 0001000, where the one identifies the unit element to be selected.

In the last unit selection cycle, there are five unit elements to be selected as represented by Flash bitmap state 601H. Accordingly, something new has happened that did not happen in any of the prior seven selection cycles. Overflow has occurred. The number of units to be selected is 5, whereas there is only 1 element that is identified as less-used (see the clear bit Nmem[4]). Accordingly, Nelem is 5, whereas Nopen is only 1. Since Nelem is greater than Nopen, the overflow condition has occurred. This is an example of the No condition of decision block 203 and the Yes condition of decision block 207. In this case, all of the less-used unit elements are selected. This represents an example of the act 206 of FIG. 2. In one example, this is accomplished by taking the one's compliment of Nmem according to the following Equation 2.

$$\text{Nmem} = \text{Nmem} \oplus \text{ones}(\text{length}(\text{Nmem})) \quad (2)$$

This results in new Nmem bitmap state 602H. The number of unit elements needed on the current iteration is updated according to form Flash bitmap state 601I. Note that now the thermometer code has been reduced from 5 to 4, reflecting that one of the unit elements has already been selected. If there were two unit elements selected from the less-used unit elements, then the Flash bitmap would be reduced to 3 instead.

The updated state 601I of the Flash bitmap is then shuffled and to form Nshuffle state 602I. The elements to be used on the current iteration are determined in the manner previously described. Specifically, the set bits of Nshuffle including bits Nshuffle[6,5,2,0] may be copied into the corresponding New-Mem bits NewMem[6,5,2,0] to create NewMem state 604I since the corresponding bits Nmem[6,5,2,0] are all clear. Although the placement of the new elements proceeds as previously described, the final determination of Nsel and Nmem differs in this overflow condition. When overflow occurs, Nmem briefly no longer represents the less-used and more-used unit elements. Instead, the set elements of Nmem represent less-used elements that are to be selected during the current selection cycle. This implies that when overflow occurs, all the set elements in Nmem along with all of the set elements in Nshuffle that were input to the current selection cycle should be selected during the current iteration. Therefore, NewMem contains the elements to be used on the current iteration. That is, NewMem state 604I is defined by Equation 3 as follows:

$$\text{NewMem} = \text{Nmem} + \text{Nshuffle} \quad (3)$$

where + represents a bitwise logical OR operation.

In addition, the Nsel bitmap state 605I is simply set equal to the NewMem bitmap state 604I.

In this state, the set bits in Nmem (i.e., Nmem[4]) have been used one less time than the other set bits in NewMem (i.e., NewMem[6,5,4,2,0]. The selection process will thus restore the Nmem bitmap to a proper state of representing less and more-used elements by applying the following Equation 4 prior to using Nmem as input to the next selection cycle.

$$\text{Nmem} = \text{Nmem} \oplus \text{NewMem} \quad (4)$$

Propagation delay using this method is approximately proportional to the square of the number of unit elements. For systems with a large number of unit elements, this propagation delay may be too long. To shorten the propagation delay to more on the order of the number of unit elements (as opposed to the square of the number of unit elements), the following look-ahead approach may be carried out. With look-ahead, the selection is faster, but may require more area. This is because look-ahead may use additional system elements (such as multiplexers) to determine the location of the unused elements, and place the new elements. The previously described selection process, on the other hand, may perhaps use just AND or OR gates to place the incoming elements.

The look-ahead selection process may use the exact same process to shuffle the incoming Flash bitmap to generate Nshuffle. Furthermore, the same process may be used to determine whether overflow has occurred, and to create the vectors Nsel and Nmem. However, the method for placing the incoming elements differ.

With look-ahead, the algorithm begins by computing two intermediate vectors. The first vector is computed by OR'ing the input vector Nshuffle with the memory vector Nmem according to the following Equation 5:

$$\text{FillEmpty} = \text{Nshuffle} + \text{Nmem} \quad (5)$$

The resulting vector FillEmpty contains a record of all the elements used up until the current iteration along with all of the elements that will be selected on the current iteration that do not conflict with previously used elements. Again, the Nshuffle and Nmem bitmaps may be computed in exactly the same manner described above with the selection process of FIG. 6.

A Cnflcts bitmap contains a record of the unit elements of Nshuffle that coincide with unit elements that are not less-used unit elements. Cnflcts is computed by bitwise AND'ing Nshuffle with Nmem according to Equation 6 as follows $$\text{Cnflcts} = \text{Nshuffle} * \text{Nmem} \quad (6)$$

where * represents a bitwise logical AND operation.

The number of conflicts is stored in the variable Count.

Next the look-ahead selection process determines the indices of the unused elements. It does this by finding the 0's in FillEmpty and storing the indices of these 0's in the vector IndVec. It then sets the required elements (determined by the value of Count and the indices stored in IndVec) and stores them in the vector NewFill. The variable SEL determines whether the vector NewFill is populated from the most significant index to the least significant index (SEL=1) or vice versa. For example; if Count=3, SEL=1, and IndVec=[7,6,3, 2], 1's will be placed in NewFill[7], NewFill[6], and NewFill [3]. Alternatively, where Count is less than the total available less-used unit elements specified in IndVec, randomization may be imposed on how the subset of unit elements is chosen from the available less-used unit elements specified in IndVec.

The FillEmpty and NewFill bitmaps are then bitwise logically OR'ed together and placed into the vector NewMem as stated in the following Equation 7.

$$\text{NewMem} = \text{FillEmpty} + \text{NewFill} \quad (7)$$

The output vectors Nmem and Nsel may then be computed in exactly the same manner as we previously described with respect to the selection process of FIG. 6.

An example processing flow of this look-ahead selection process will be described with respect to FIGS. 7A through 7I. FIGS. 7A through 7G each represent particular parameters used during the first through seventh selection cycles accordingly. Figures H and I represent particular parameters used during the eighth selection cycle. The input Flash bitmap states 701A through 701I are exactly the same as in the example of FIG. 6 corresponding to Flash bitmap states 601A through 601I. This is to keep the example of FIG. 7 consistent with FIG. 6. Likewise, the Nshuffle bitmap states 702A through 702G and 702I are exactly the same as for corresponding Nshuffle states 602A through 60GG and 602I. This is because the process of generating the Nshuffle bitmap is the same as that of FIG. 6, although the shuffling process remains non-deterministic. The output Nmem bitmap states 703A through 703I and the Nsel bitmap states 711A through 711G and 711I are also the same as the corresponding bitmap states of FIG. 6. This is because although the process of selecting the unit elements uses look-ahead in FIG. 7, the selection process may still result in the selection of the same unit elements, albeit with less propagation delay.

In the first selection cycle 700A having parameters illustrated in FIG. 7A, the FillEmpty bitmap state 704A is obtained according to Equation 5 using the corresponding bitmaps Nshuffle and Nmem for that selection cycle. The same is true for all of the FillEmpty bitmap states 704B through 704G and 704I with respect to their respective subsequent selection cycle. The FillEmpty bitmap states contain a record of all more-used elements along with all of the elements that will be selected on the current iteration that do not conflict with previously used elements.

The Cnflcts bitmap state 705A is obtained according to Equation 6 using the corresponding bitmaps Nshuffle and Nmem for that selection cycle. The same is true for all of the Cnflcts bitmap states 705B through 705G and 705I with respect to their corresponding selection cycles. The Cnflcts bitmap states contain a record of all unit elements of Nshuffle that could not be placed directly into NewMem because the corresponding bit of Nmem was already set. Count 706A represents the count of the number of set bits in Cnflcts 705A. The same is true of 706B through 706G and 706I with respect to their respective subsequent selection cycle.

The IndVec bitmap state 707A represents as ones all of the zeros in FillEmpty 704A. Thus, IndVec bitmap state 707A represents all of the less-used unit elements that could be selected and that exclude the less-used elements that will already be chosen by non-conflicting set bits of the Nshuffle bitmap set. Thus, IndVec 707A represents available less-used elements that may be chosen. Sel 708A represents a direction that the available less-used elements of IndVec 707A should be chosen. Sel=0 represents that the least significant bits are to be chosen first. Sel=1 represents that the most significant bits are to be chosen first. The value of Sel 708A in this selection cycle is moot since Count=0 indicates that no such available unit elements are to be chosen. For this same reason, NewFill bitmap state 709A is all clear.

NewMem bitmap state 710A is then calculated according to Equation 7 using FillEmpty state 704A and NewFill state 709A as inputs. The same may be said for the NewMem bitmap states 710B through 710G and 710I with respect to their respective subsequent selection cycle.

In the second selection cycle 700B represented in FIG. 7B, FillEmpty bitmap state 704B represents that all less-used unit elements have been selected, and Cnflcts bitmap state 705B represents that there were no unit elements identified in Nshuffle that cannot be placed into NewMem without initially conflicting with a set bit in Nmem. IndVec bitmap state 707B is all clear representing that there are no further unit elements that can be selected, which is fine because Count 706B is equal to zero. For this same reason, NewFill state 709B is also all clear, and Sel 708B is moot.

Figure 7C:
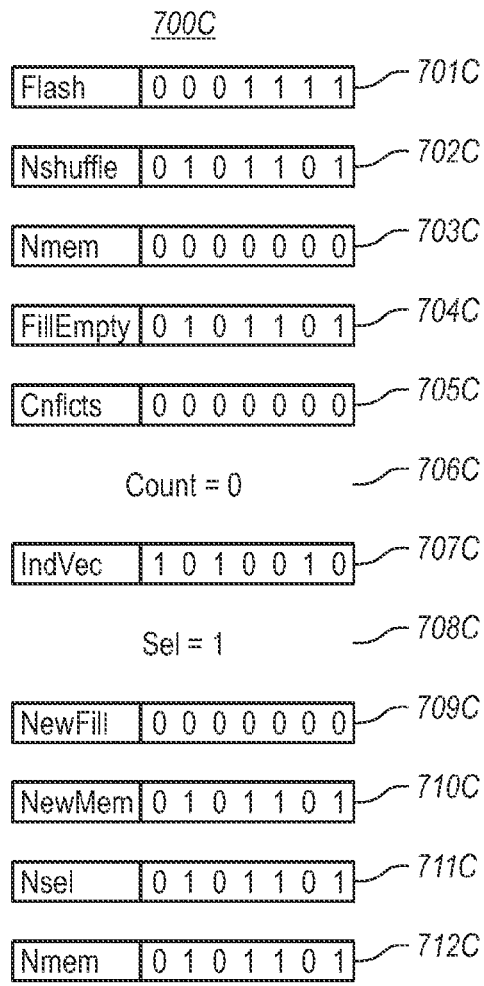

In the third selection cycle 700C represented in FIG. 7C, FillEmpty bitmap state 704C represents that four less-used unit elements have been already been selected, and Cnflcts bitmap state 705C represents that there were no unit elements identified in Nshuffle that cannot be placed into NewMem without initially conflicting with a set bit in Nmem. IndVec bitmap state 707C identifies three unit elements that can be selected in the case of a conflicting unit element. However, since there are no conflicting unit elements (i.e., Count 706C equals zero), NewFill state 709C is clear, and Sel 708C is moot.

Figure 7D:
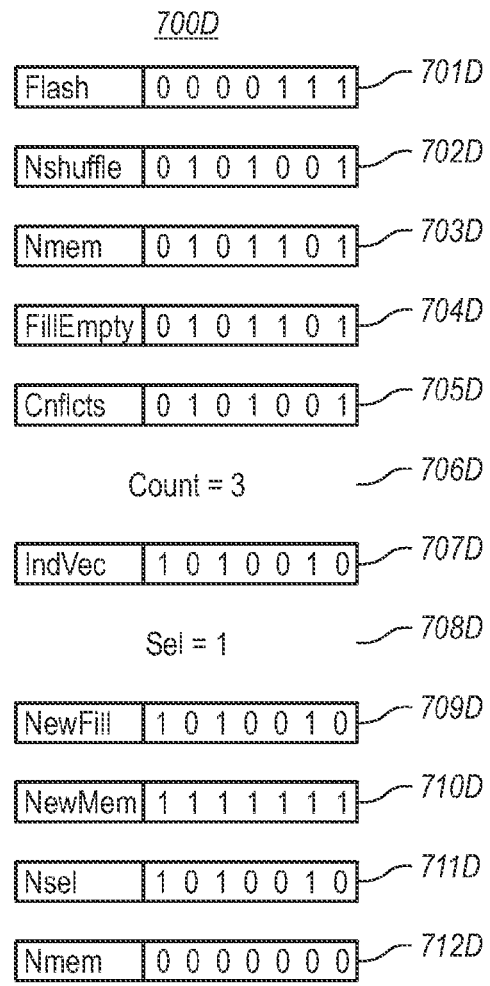

In the fourth selection cycle 700D represented in FIG. 7D, FillEmpty bitmap state 704D represents the four more-used elements that were previously used in a prior selection cycle along with zero less-used unit elements have been already been selected in the current selection cycle, and Cnflcts bitmap state 705D identifies three conflicting unit elements of Nshuffle that could not yet be selected due to a conflicting set bit in Nmem. Accordingly, Count 706D is equal to 3. IndVec bitmap state 707D identifies three unit elements that could be chosen as a substitute for conflicting unit elements. NewFill 709D represents the three bits that were chosen from IndVec 707D. The Sel 708D variable is still moot since all set bits of IndVec 707D have been chosen.

In the fifth selection cycle 700E represented in FIG. 7E, FillEmpty bitmap state 704E represents that represents the zero more-used elements that were previously used in a prior selection cycle along with two less-used unit elements have been already been selected in the current selection cycle. Cnflcts bitmap state 705E represents that there were no unit elements identified in Nshuffle 702E that cannot be placed into NewMem 710E without initially conflicting with a set bit in Nmem 703E. IndVec bitmap state 707E identifies five unit elements that can be selected in the case of a conflicting unit element. However, since there are no conflicting unit elements (i.e., Count 706E equals zero), NewFill state 709E is clear, and Sel 708E is moot.

In the sixth selection cycle 700F represented in FIG. 7F, FillEmpty bitmap state 704F represents the two more-used elements that were previously used in a prior selection cycle along with the two less-used unit elements have been already been selected in the current selection cycle. Cnflcts bitmap state 705F identifies one conflicting unit elements of Nshuffle 702F that could not yet be selected due to a conflicting set bit in Nmem 703F. Accordingly, Count 706F is equal to 1. IndVec bitmap state 707F identifies three unit elements that could be chosen as a substitute for conflicting unit elements. Sel 708F is equal to 0 specifying the unit elements are to be selected beginning from the least significant bit. Accordingly, NewFill 709F represents the one bit that were chosen from IndVec 707F, namely IndVec[0].

Figure 7G:
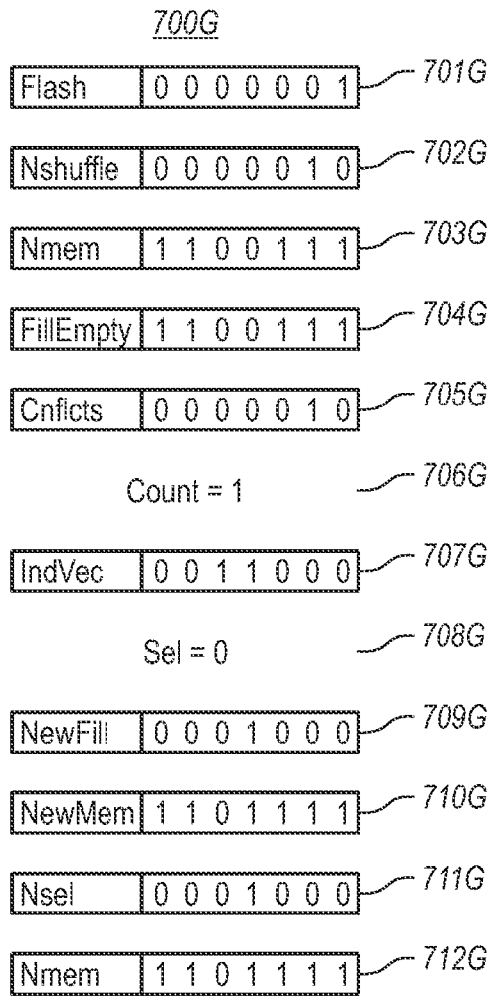

In the seventh selection cycle 700G represented in FIG. 7G, FillEmpty bitmap state 704G represents the five more-used elements that were previously used in a prior selection cycle along with zero less-used unit elements have been already been selected in the current selection cycle. Cnflcts bitmap state 705G identifies one conflicting unit elements of Nshuffle 702G that could not yet be selected due to a conflicting set bit in Nmem 703G. Accordingly, Count 706G is equal to 1. IndVec bitmap state 707G identifies two unit elements that could be chosen as a substitute for conflicting unit elements. Since Count 706G is equal to one, and Sel 708G is equal to 0, the least significant set bit of IndVec 707G is chosen as represented by NewFill 709G. Accordingly, NewFill[3] is set.

In the eighth selection cycle 700H and 700I, there are five unit elements to select as represented by Flash bitmap state 701H. However, there is only one less-used unit element. Overflow occurs, and the bit Nmem[4] is set the same as described above for Nmem 602H of FIG. 6. Similarly, Flash, Nshuffle, and Nmem bitmaps 701I, 702I and 703I are created in the same manner described for bitmaps 601I, 602I and 603I of FIG. 6.

FillEmpty bitmap state 704I represents that logical OR'ing of Nshuffle 702I and Nmem 703I, and Cnflcts bitmap state 705C represents that there were no unit elements identified in Nshuffle that cannot be placed into NewMem without initially conflicting with a set bit in Nmem. IndVec bitmap state 707I identifies two unit elements that can be selected in the case of a conflicting unit element. However, since there are no conflicting unit elements (i.e., Count 706I equals zero), New-Fill state 709I is clear, and Sel 708I is moot.

Accordingly, various embodiments of a unit elements selection mechanism has been described that attenuates tones in the signal band, and that permits the corresponding system to generate first-order noise, rather than white noise, thereby improving the signal-to-noise ratio.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A method for managing the use of a plurality of physical unit elements, the method comprising:
    identifying by a physical system a number of a plurality of physical unit elements that are to be selected for use in a current selection cycle, the physical system operating using a sequence of selection cycles, the system including the plurality of physical unit elements, a subset of the plurality of physical unit elements to be selected for use in any given selection cycle, wherein the plurality of unit elements includes a less-used portion of one or more of the plurality of physical unit elements, and a more-used portion of one or more of the plurality of physical unit elements, wherein each of the unit elements in the more-used portion has been used at least one more time than each of the unit elements in the less-used portion since a particular time, wherein the number of the plurality of physical unit elements that is identified as to be selected for use in the current selection cycle is greater than zero, but less than the number of unit elements in the less-used portion;
    selecting by the physical system the identified number of unit elements from the less-used portion, wherein an order of selection of the less-used portion is not predetermined prior to the selecting; and
    using the selected elements in the current selection cycle in response to the selecting.

2. A method in accordance with claim 1, wherein the selecting is performed such that a probability of selecting any given unit element in the less-used portion is approximately constant from one selection cycle to another given a particular number of unit elements to be selected and given a particular set of unit elements in the less-used portion.

3. A method in accordance with claim 1, wherein the selecting is performed such that given a particular number of unit elements to be selected and given a particular set of unit elements in the less-used portion, there is at least a possibility that any permutation for the particular number of the unit elements may be selected from the particular set of unit elements.

4. A method in accordance with claim 1, wherein the selecting comprises:
    randomly or pseudo randomly formulating an initial set of unit elements from all of the plurality of physical unit elements in the current selection cycle;
    determining for each of the initial set of unit elements whether the unit element is included in the less-used portion of the unit elements;
    for any of the initial set of unit elements that are included in the less-used portion of the unit elements, selecting the unit element.

5. A method in accordance with claim 4, wherein the selecting further comprises:
    for any of the initial set of unit elements that are not included in the less-used portion of the unit elements, searching through the less-used portion until a unit element is found; and
    selecting the found unit element.

6. A method in accordance with claim 4, wherein the selecting further comprises:
    identifying a number, an initial conflicting number, of unit element in the initial set of elements that are not included in the less-used portion of the unit elements; and
    selecting the identified initial conflicting number not from the initial set, but from the less-used portion of the unit elements in a predetermined order.

7. A method in accordance with claim 5, wherein the searching through is performed in a configurable direction.

8. A method in accordance with claim 7, wherein the configurable direction is changeable from one selection cycle to the next.

9. A method in accordance with claim 1, further comprising:
    keeping track of the identity of the unit elements in the less-used portion.

10. A method in accordance with claim 9, wherein the keeping track is performed using a digital state machine.

11. A method in accordance with claim 9, wherein the keeping track is performed using analog switching circuitry.

12. A method in accordance with claim 9, further comprising:
    updating the identity of the unit elements in the less-used portion and the more-used portion to reflect the using of the selected elements.

13. A method in accordance with claim 12, further comprising the following for a subsequent selection cycle:
    identifying another number of the plurality of physical unit elements that are to be selected for use in the subsequent selection cycle, the another number being greater than zero, but less than the number of unit elements in the updated less-used portion;
    selecting the another number of unit elements from the updated less-used portion, wherein an order of selection of the updated less-used portion is not predetermined prior to the selecting in the subsequent selection cycle; and
    using the selected elements in the subsequent selection cycle in response to the selecting in the subsequent selection cycle.

14. A method in accordance with claim 12, further comprising the following for a subsequent selection cycle:
    identifying another number of the plurality of physical unit elements that are to be selected for use in the subsequent selection cycle, the another number being greater than the number of unit elements in the updated less-used portion by an excess number;
    selecting all of the unit elements in the updated less-used portion thereby leaving only the excess number of the plurality of unit elements to be selected for the subsequent selection cycle;
    selecting the excess number of unit elements from the updated more-used portion, wherein an order of selection of the updated more-used portion is not predetermined prior to the selecting in the subsequent selection cycle; and using all of the updated less-used portion of the unit elements, and the selected elements of the updated more-used portion in response to the selecting the excess number.

15. A method in accordance with claim 1, wherein each of the unit elements in the more-used portion has been used only one more time than each of the unit elements in the less-used portion since the particular time.

16. A method for managing the use of a plurality of physical unit elements, the method comprising:

identifying the to be selected by a physical system a number of a plurality of physical unit elements that are to be selected for use in a current selection cycle, the physical system operating using a sequence of selection cycles the system including the plurality of physical unit elements a subset of the plurality of physical unit elements to be selected for use in any given selection cycle, wherein the plurality of unit elements includes a less-used portion of one or more of the plurality of physical unit elements, wherein the plurality of physical unit elements includes a less-used portion of one or more of the plurality of physical unit elements and a more-used portion of one or more of the plurality of physical unit elements wherein each of the unit elements in the more-used portion has been used at least one more time than each of the unit elements in the less-used portion since a particular time, wherein the number of the plurality of physical unit elements that is identified as to be selected for use in the current selection cycle is greater than the number of unit elements in the less-used portion by an excess number;

selecting all of the unit elements in the less-used portion thereby leaving only the excess number of the plurality of unit elements to be selected;

selecting the excess number of unit elements from the more-used portion, wherein an order of selection of the more-used portion is not predetermined prior to the selecting; and using in the current selection cycle all of the less-used portion of the unit elements, and the selected elements of the more-used portion in response to the selecting the excess number.

17. A method in accordance with claim 16, further comprising:

keeping track of the identity of the selected elements from the more-used portion such that the selected elements in the more-used portion are included in an updated more-used portion, and such that the selected elements from the more-used portion are included in an updated less-used portion.

18. A method in accordance with claim 16, wherein the keeping track is performed by a memory.

19. A system that operates using a sequence of selection cycles, the system comprising:

a plurality of physical unit elements;

an element selection component configured to perform the following method for each of at least some selection cycles:

identify a less-used portion and more-used portion of the plurality of unit elements, wherein each of the unit elements in the more-used portion has been used one more time than each of the unit elements in the less-used portion since a particular time;

identify a number of the plurality of unit elements that are to be selected for use, the number being greater than zero, but less than the number of unit elements in the less-used portion;

determine whether or not the identified number of unit elements is less than the number of unit elements in the less-used portion;

if this determination determines that the selected number of unit elements is less, then selecting the to be selected number of unit elements from the less-used portion, wherein an order of selection of the less-used portion is not predetermined prior to the selecting; and using the selected elements in response to the selecting.

20. A system in accordance with claim 19, wherein the element selection component is further configured to perform the following for each of the at least some of the selection cycles if the determination determines that the selected number of unit elements is not less:

select all of the unit elements in the less-used portion;

if there is an excess number of the plurality of unit elements to be selected, selecting the excess number of unit elements from the more-used portion, wherein an order of selection of the more-used portion is not predetermined prior to the selecting; and using all of the less-used portion of the unit elements, and the selected elements of the more-used portion, if any in response to the selecting the excess number.

21. The system in accordance with claim 19, wherein the system is a feedback multi-bit Digital-to-Analog Converter (DAC) of a sigma-delta Analog-to-Digital Converter (ADC).

* * * * *

UNITED STATES PATENT AND TRADEMARK OFFICE
CERTIFICATE OF CORRECTION

PATENT NO.         : 7,663,523 B1
APPLICATION NO.    : 12/098357
DATED              : February 16, 2010
INVENTOR(S)        : Keppler et al.

It is certified that error appears in the above-identified patent and that said Letters Patent is hereby corrected as shown below:

On the Title Page
Item 56, OTHER PUBLICATIONS, Page 1, Right Hand Column, change "Geerts, Y. el al. A High-Performance Multibit $\Delta\Sigma$ CMOS ADC. Journal of Solid State Circuits, Dec. 2000." to --Geerts, Y. et al. A High-Performance Multibit $\Delta\Sigma$ CMOS ADC. Journal of Solid State Circuits, Dec. 2000.--

Column 3
Line 49, change "represents" to --represent--

Column 4
Line 3, after "mismatch noise" insert --,--

Column 6
Line 11, after "each" insert --of the--

Column 7
Line 53, change "non-linearly" to --non-linearity--
Line 54, change "non-linearly" to --non-linearity--

Column 8
Line 59, change "FIG. 3" to --FIG. 2--
Line 59, after the instance of "of" insert --the--

Column 10
Line 1, change "correspond" to --corresponding--
Line 30, change "illustrated" to --illustrating--

Column 11
Line 26, remove [and]

Signed and Sealed this

Twelfth Day of October, 2010

David J. Kappos
*Director of the United States Patent and Trademark Office*

Figure 7H:
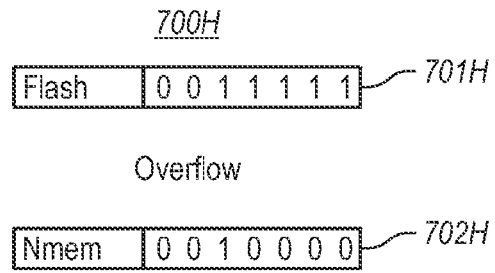
FIGS. 7H and 7I illustrate the state of various data structures that may be used to select unit elements in accordance with the second aspect in the case in which an overflow condition is experienced in the eighth consecutive selection cycle.
Figure 7I:
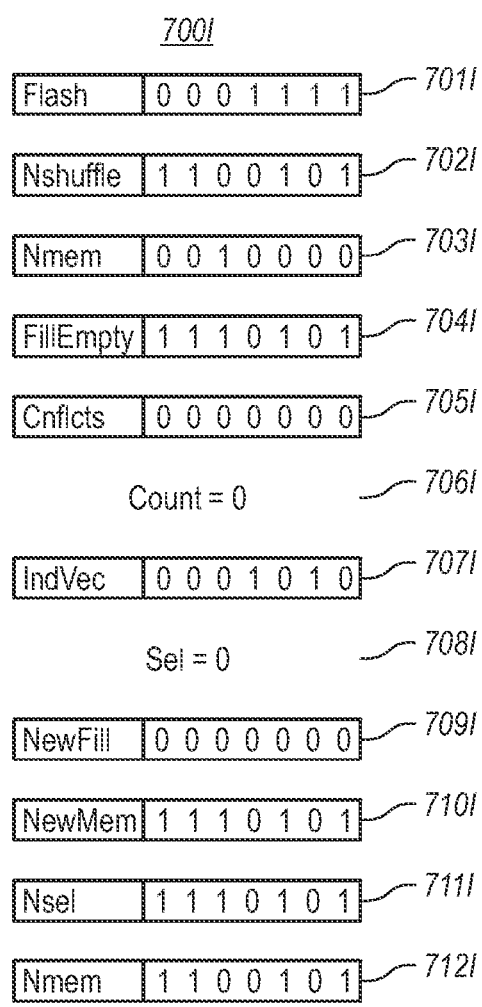

Column 12
Line 58, change "Figures H and I" to --Figures 7H and 7I--
Line 65, change "60GG" to --602G--

Column 13
Line 22, change "7051" to --705I--

Column 14
Line 18, remove the second instance of [represents]
Line 35, change "elements" to --element--
Line 42, change "were" to --was--
Line 49, change "elements" to --element--

Column 15
Line 8, change "elements" to --element--

Column 17
Line 14, remove [the to be selected]
Line 17, after "cycles" insert --,--
Line 19, after "ments" insert --,--
Line 25, after "elements" insert --,--
Line 27, after "elements" insert --,--